United States Patent
Shah et al.

(10) Patent No.: US 9,551,049 B2
(45) Date of Patent: Jan. 24, 2017

(54) HIGH ELASTIC MODULUS SHAFTS AND METHOD OF MANUFACTURE

(75) Inventors: Dilip M. Shah, Glastonbury, CT (US); Herbert A. Chin, Portland, CT (US); John Joseph Marcin, Marlborough, CT (US); Paul L. Reynolds, Tolland, CT (US); Gabriel L. Suciu, Tolland, CT (US); Paul D. Genereux, Stuart, FL (US); Carl E. Kelly, Plantsville, CT (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 1131 days.

(21) Appl. No.: 13/596,338

(22) Filed: Aug. 28, 2012

(65) Prior Publication Data

US 2014/0060708 A1 Mar. 6, 2014

(51) Int. Cl.
| | |
|---|---|
| C22F 1/10 | (2006.01) |
| C22C 19/03 | (2006.01) |
| C22C 38/00 | (2006.01) |
| F01D 5/02 | (2006.01) |

(Continued)

(52) U.S. Cl.
CPC ............... *C22C 19/03* (2013.01); *C22C 38/00* (2013.01); *C22F 1/10* (2013.01); *C30B 29/52* (2013.01); *C30B 33/02* (2013.01); *F01D 5/02* (2013.01); *F05D 2300/606* (2013.01); *Y02T 50/672* (2013.01)

(58) Field of Classification Search
None
See application file for complete search history.

(56) References Cited

U.S. PATENT DOCUMENTS

| | | | |
|---|---|---|---|
| 4,481,047 A | 11/1984 | Winfree et al. | |
| 4,514,360 A * | 4/1985 | Giamei | C22F 1/10 148/410 |
| 4,518,442 A | 5/1985 | Chin | |

(Continued)

FOREIGN PATENT DOCUMENTS

| | | |
|---|---|---|
| EP | 0059549 | 2/1982 |
| EP | 0066971 A2 | 12/1982 |

OTHER PUBLICATIONS

Office Action for related Chinese Application No. 201380045695.9; action dated Aug. 6, 2015.

(Continued)

*Primary Examiner* — George Wyszomierski
(74) *Attorney, Agent, or Firm* — Cantor Colburn LLP

(57) ABSTRACT

High modulus turbine shafts and high modulus cylindrical articles are described as are the process parameters for producing these shafts and cylindrical articles. The shafts/articles have a high Young's modulus as a result of having high modulus <111> crystal texture along the longitudinal axis of the shaft/article. The shafts are produced from directionally solidified seeded <111> single crystal cylinders that are axisymmetrically hot worked before a limited recrystallization process is carried out at a temperature below the recrystallization temperature of the alloy. The disclosed process produces an intense singular <111> texture and results in shaft or cylindrical article with a Young's modulus that is at least 40% greater than that of conventional nickel or iron alloys or conventional steels.

13 Claims, 5 Drawing Sheets

(51) Int. Cl.
*C30B 29/52* (2006.01)
*C30B 33/02* (2006.01)

(56) References Cited

U.S. PATENT DOCUMENTS

| | | | |
|---|---|---|---|
| 4,528,048 A * | 7/1985 | Gell | C30B 33/00 |
| | | | 148/404 |
| 4,605,452 A * | 8/1986 | Gemma | C30B 11/00 |
| | | | 148/404 |
| 4,702,782 A | 10/1987 | Chin | |
| 5,665,180 A * | 9/1997 | Seetharaman | C22F 1/10 |
| | | | 148/527 |
| 6,042,553 A | 3/2000 | Solar et al. | |
| 6,544,357 B1 | 4/2003 | Hehmann et al. | |
| 7,338,259 B2 | 3/2008 | Shah et al. | |
| 7,871,247 B2 | 1/2011 | Shah et al. | |
| 2003/0041801 A1 | 3/2003 | Hehmann | |
| 2005/0196258 A1 | 9/2005 | Stabs | |
| 2007/0000581 A1 | 1/2007 | Cetel et al. | |
| 2009/0297359 A1 | 12/2009 | Shah et al. | |
| 2010/0135846 A1 | 6/2010 | Cetel et al. | |
| 2011/0052443 A1 | 3/2011 | Hanlon et al. | |
| 2011/0081235 A1 | 4/2011 | Shah et al. | |
| 2011/0114230 A1 | 5/2011 | Syed et al. | |

OTHER PUBLICATIONS

International Search Report and Written Opinion for related International Application No. PCT/US2013/44009; report dated Oct. 25, 2013.

\* cited by examiner

HIGH ELASTIC MODULUS SHAFTS AND METHOD OF MANUFACTURE

TECHNICAL FIELD

This disclosure is directed to high elastic modulus shafts and other cylindrical articles. More specifically, methods of making high elastic modulus shafts and other cylindrical articles are disclosed which include seeding and casting single crystal investment castings in a desired crystallographic orientation and methods of hot working the same while preserving grain texture and limiting recrystallization. The approach in certain condition can also result with unusually high tensile and torsion strength materials.

BACKGROUND

Metallic materials generally have a crystalline form. Individual atoms of the material have a predictable relationship to their neighboring atoms which extend in a repetitive fashion throughout a particular crystal or grain. The properties of such crystals vary significantly with orientation.

Most metallic articles contain thousands of individual crystals or grains. The properties of metallic articles in a particular direction depend on an average orientation of the individual crystals which make up the article. If the grains or crystals have a random orientation, the article properties will be isotropic, or equal in all directions. This is rarely the case since most casting, deformation, and recrystallization processes produce at least some crystal orientation or texture.

Crystals contain planes of atoms having particular spacings. These planes are identified by Miller indices of the form (111), (110), (100) etc. X-ray measurements can be made and texture intensities can be characterized as 1×, 5× random, etc., with 5× random indicating a more intense texture than, for example, 2× random.

In rotating machines such as turbofans, auxiliary power generators, as well as industrial gas turbines, the drive shafts are typically long and transfer power generated by rotating turbine blades to the compressor blades as well as a large fan in the front of the engine to compress the air. In helicopter engines, the drive shaft drives the propeller.

In these and similar applications, the drive shafts are suspended between bearings or extended from a single bearing so the shaft behaves like a simple rotating beam, or a cantilever. The deflection of the shaft is inversely proportional to the axial stiffness or Young's modulus of the material. The Young's modulus limits the natural frequency of the vibration and consequently the maximum rotation speed of the shaft. From this perspective, increasing the axial stiffness, and therefore the Young's modulus, of the shaft is desirable as it enables higher rotation speeds.

Stiff shafts are more forgiving to imbalanced rotating loads of blades and disks in turbine engines. Stiff shafts also decrease the contact of the blade tips with the outer casing, thereby reducing leakage and improving efficiency. Alternatively, an increase in stiffness allows for a longer shaft or increased spacing between the supporting bearings. Reducing the bearing assemblies not only can save weight, but may also provide the design flexibility for accommodating a greater number of turbine stages without interference of bearing assemblies. Piping for delivering lubricant to the bearing assemblies can also be reduced. Other applications for stiffer shafts will be apparent to those skilled in the art.

Given that drive shaft failure is not acceptable, shafts are typically over-designed or based on a projected life. Further, drive shafts are unlikely to be made out of any other materials other than metals, with high ductility and toughness. Consequently, it is desirable to employ a shaft material having the highest possible Young's modulus to minimize deflections. Among metals, except very high density tungsten and rhenium, Young's modulus of elasticity for most common polycrystalline steel and nickel base alloys is approximately 30 Mpsi (207 GPa) at room temperature. Increasing the room temperature Young's modulus beyond 60 Mpsi (414 GPa) may be possible with ceramic materials such as oxides and carbides, but the brittle nature of these materials makes them unsuitable for shafts of rotating machines. Another approach is to produce metal matrix composite with high strength fibers of for example alumina or SiC. But this approach is also deemed risky due to inconsistent mechanical behavior associated with a coarse and uncontrolled fiber structure.

Therefore, there is a need for processes such as single crystal castings, large single crystal castings, investment castings and hot working of single crystal castings that produce shafts and other articles with a higher Young's modulus than currently available.

SUMMARY OF THE DISCLOSURE

This invention relates to a metallic component for a rotating machine, such as a drive shaft for a turbine or other cylindrical structure. The shaft or cylinder are formed with a high modulus orientation <111> of an iron or nickel base alloy being aligned in the axial, i.e. primary, direction of the shaft or cylinder. It is understood that if the alloy were cobalt base with hexagonal crystal structure the high modulus direction will be <0001> or the c-axis of the crystal, and if the alloy were molybdenum based the high modulus direction will be <100>.

In an embodiment, a method for producing a high elastic modulus shaft from an alloy is disclosed. The method includes providing a single crystal cylinder of the alloy. The single crystal cylinder has a longitudinal axis. The single crystal cylinder is also seeded so that a high modulus <111> direction is at least substantially parallel to the longitudinal axis. The method also includes hot working the cylinder to achieve the desired size of the cylinder and heat treating the cylinder at a temperature below a recrystallization temperature of the alloy.

Another method of producing a high elastic modulus shaft from an alloy is disclosed. The method includes casting a single crystal cylinder from the alloy. The single crystal cylinder has a longitudinal axis. The single crystal cylinder is seeded so that a high modulus <111> direction is at least substantially parallel to the longitudinal axis of the cylinder. The method also includes axisymmetrically hot working the cylinder to achieve a desired size of the cylinder at a temperature below the recrystallization temperature of the alloy. Further, the method includes heat treating the cylinder at a temperature below the recrystallization temperature of the alloy.

A high modulus shaft is also disclosed which includes a longitudinal axis. The shaft includes a hot worked, limited recrystallized single crystal of an alloy having a high modulus <111> direction that is at least substantially parallel to the longitudinal axis of the shaft.

DETAILED DESCRIPTION

Investment casting is one of the oldest known metal-forming techniques. Beeswax was originally used to form investment castings. Today, high-technology waxes, refractory materials and special alloys are used in investment castings, which provide accuracy, repeatability, versatility and integrity for a variety of metals and high-performance alloys.

The turbofan is a type of jet engine is widely used for aircraft propulsion. The turbofan is basically the combination of two engines, a turbo portion which is a conventional gas turbine engine, and a propeller-like fan enclosed in a duct. The engine produces thrust through a combination of these two portions working in concert. The vast majority of turbofans follow the same basic design with a large fan or compressor at the front of the engine and a relatively small turbine or jet engine behind the large fan. There have been a number of variations on this theme, however, including dual compressors at the front of the engine and dual turbines at the rear of the engine. Other variations include rear-mounted fans which can be easily added to an existing jet engine, or designs that combine a low-pressure turbine and a fan stage in a single rear-mounted unit.

Critical to the efficiency of turbofan engines is the maintenance of minimum clearances between moving and stationary parts. The turbine drive shaft is coupled to disks and blades for rotation and transmits power from the turbine section to the compressor section of the engine. Efficient operation requires accurate location of the blades relative to the casing. Therefore, it is of the utmost importance that the turbine drive shaft be stiff and relatively free from deflection and vibration, although some vibration and deflection is unavoidable. The stresses which produce deflection and vibration of the drive shaft result from the engine operation and from externally applied loads resulting from aircraft motion.

Figure 1:
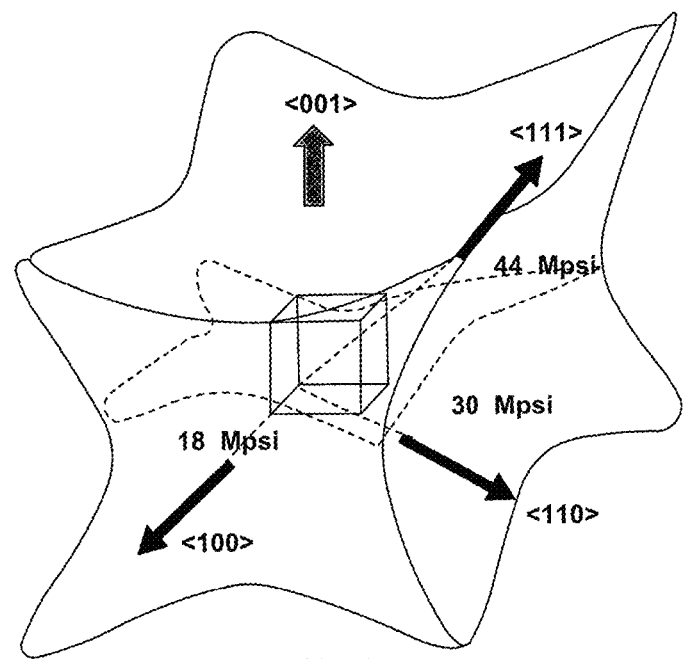
FIG. 1 illustrates a typical room temperature Young's modulus surface for nickel and iron base alloys in a single crystal with cubic structure, which may be face centered, body centered, simple cubic or some ordered variation such as B2.
Figure 2:
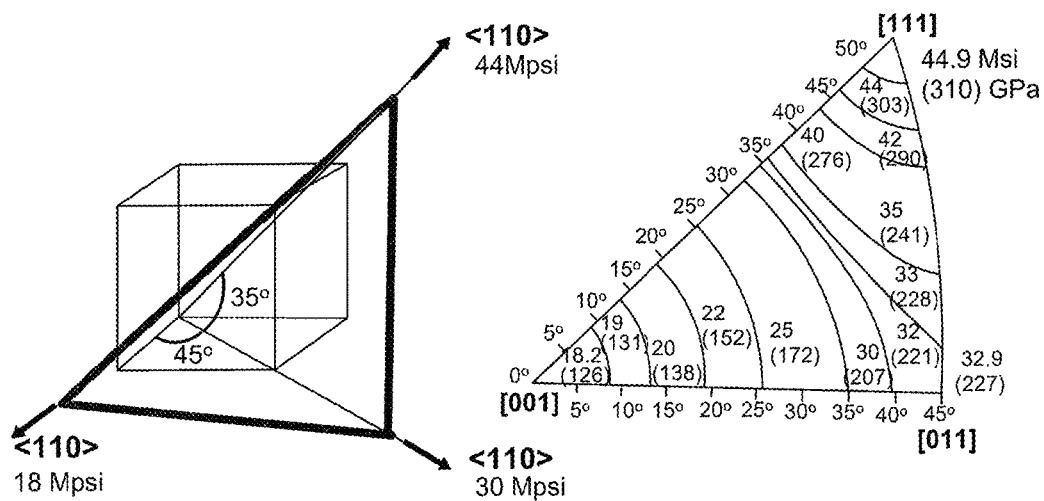
FIG. 2 illustrates how a room temperature Young's modulus varies with crystallographic direction in a typical complex nickel-base alloy represented with reference to a standard stereographic triangle.

The Young's modulus can be selectively enhanced in one direction, by exploiting the high elastic anisotropy in nickel and iron base alloy single crystals. As depicted by a schematic Young's modulus surface in FIG. 1, a room temperature elastic modulus approaching 44 Mpsi (304 GPa) can be achieved in a single crystal along the crystallographic direction <111>. Referring to FIG. 2, the variation of Young's modulus with all crystallographic directions is described by a plot presented with reference to a stereographic projection triangle. From FIGS. 1 and 2, it is clear that Young's modulus varies by at least a factor of two, with a low value of about 18 Mpsi (124 GPa) in the crystallographic <100> direction to about 44 Mpsi (304 GPa) in the crystallographic <111> direction. This variation is exploited in components such as blades and vanes made out of cast single crystal where low elastic modulus is beneficial for improving thermal mechanical fatigue and high elastic modulus is beneficial in a vibratory environment where high cycle fatigue is a concern.

Figure 3:
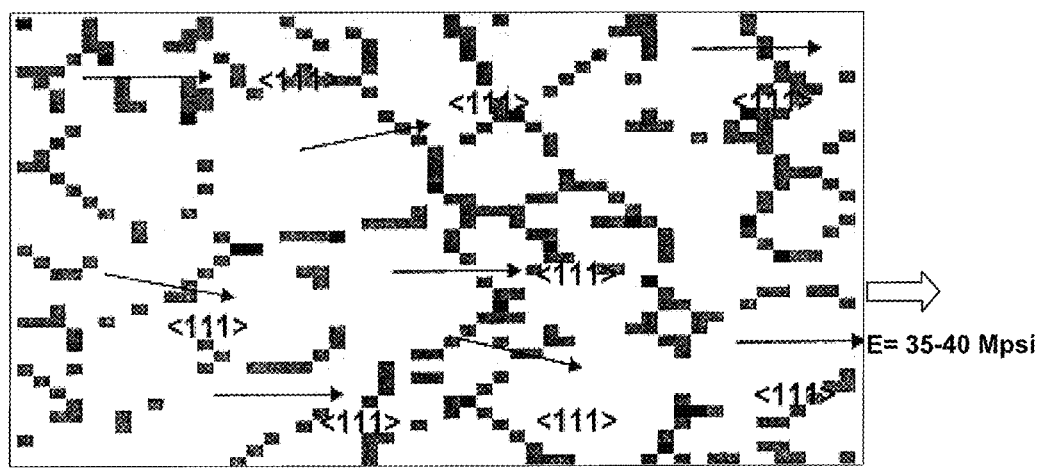
FIG. 3 schematically illustrates a highly textured polycrystalline material with majority of the grains oriented along the high modulus <111> direction.

To enhance Young's modulus, it may be impractical to make the shaft out of cast single crystal with <111> direction parallel to the shaft axis. It is commonly assumed, based on experience, that isotropic fine grained, wrought materials are superior to cast materials from the stand point of toughness and fatigue life. But this effect can also be exploited if a highly textured, polycrystalline, fine grained material can be produced, such that majority of the grains are oriented in <111> direction. Such material, depending on the degrees of the <111> grain texture in the axial direction of the shaft will on an average result in Young's modulus between 35 to 40 Mpsi (241 to 276 GPa) at room temperature as set forth in U.S. Pat. No. 4,702,782. This concept is schematically depicted in FIG. 3.

Figure 4:
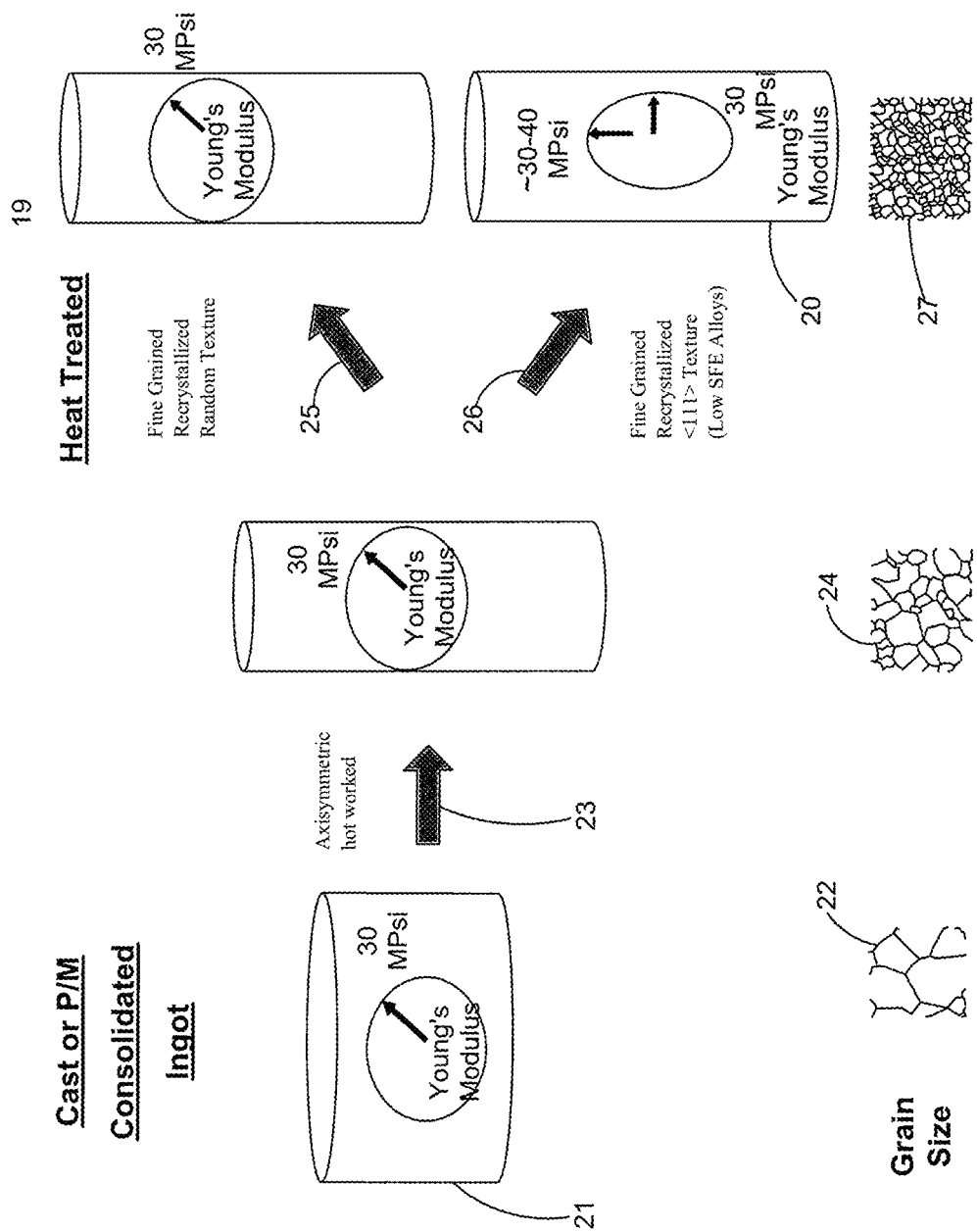
FIG. 4 schematically illustrates a prior art, random grain textured and prior art high modulus <111> grain textured shaft manufacturing process.

Referring to FIG. 4, in order to achieve fine grained and wrought structure, conventional shafts 19, 20 are made by starting with a cylindrical ingot 21, either cast or made by hot consolidation of powder of appropriate composition and having a large grain size 22. Such an ingot 21 in solid form or as a hollow cylinder is hot worked at step 23 using any of the axisymmetric methods such as swaging, extrusion, or rotary forge to achieve the final length and diameter and a somewhat smaller grain size 24. The final shaft 20 is then appropriately heat treated at steps 25 or 26 to recrystallize fine grains and achieve desired microstructure 27.

The process of FIG. 4 typically yields a final product 19 or 20 with random grain texture 27 with an isotropic Young's modulus of about 30 Mpsi (207 GPa). Some prior art processes are restricted to specific nickel alloy compositions, where the recrystallized grain texture is not random but preferentially forms the strong <111> texture. Such nickel alloy compositions typically have higher stacking fault energies. The stacking fault energy is not an easily quantifiable parameter; the prior art process of FIG. 4 is restricted to alloys empirically observed to provide a strong high modulus <111> texture such as high molybdenum containing nickel-base alloys or alloys based on precipitation of $Ni_3Si$.

Figures 5, 6:
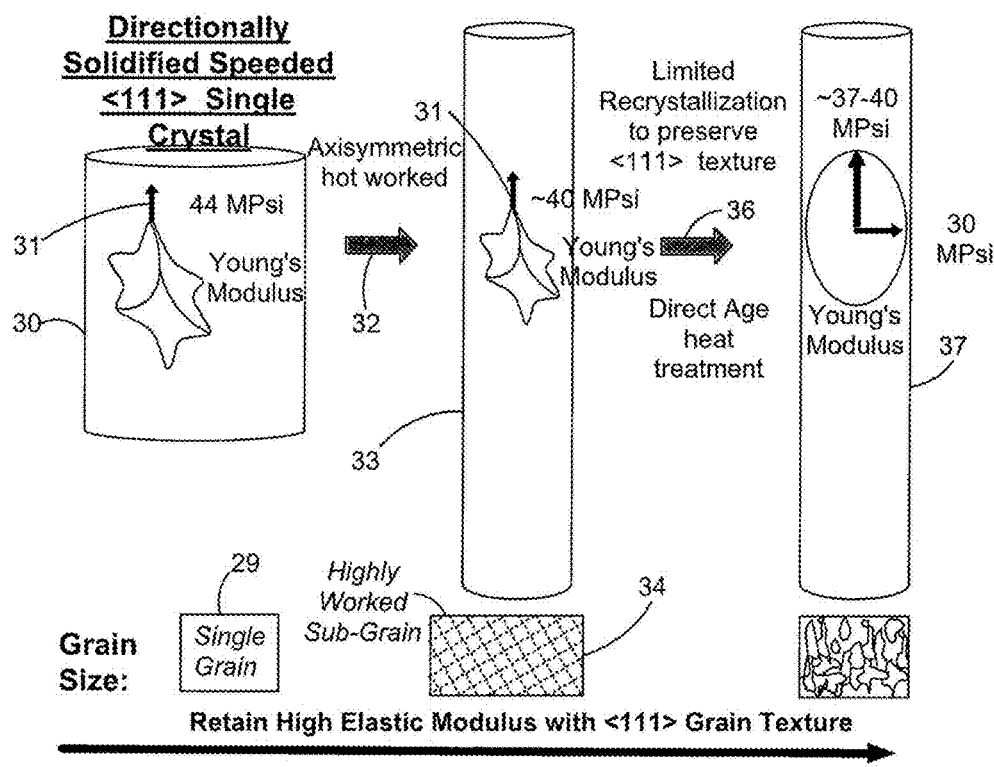
FIG. 5 schematically illustrates a disclosed method for producing a high modulus <111> grain textured shaft, based on axisymmetric hot working of a <111> oriented single crystal.
FIG. 6 illustrates a high modulus <111> oriented single crystal successfully swaged with 61% reduction in diameter and confirmed to retain the high modulus <111>.

The disclosed processes differ from the conventional processes of FIG. 4 that provide a random grain texture shaft 19 or the shaft 20 with high modulus <111> grain texture. As schematically shown in FIG. 5, the disclosed process begins a single crystal cylinder 30 specifically cast with the axis 31 parallel to the high modulus <111> direction. This may be achieved by directionally solidifying a nickel or iron base alloy ingot 30 starting with a <111> oriented seed or any other single crystal seed 29 appropriately tilted to obtain <111> direction in the direction of solidification, which is the axis 31 of the cylinder 30. The cast cylinder 30 is then appropriately heat treated at step 32 to soften the material and hot work the cylinder 30 to an appropriate reduction as shown by the intermediate product 33. The hot working step 32 is preferably carried out below the temperature at which recrystallization can be triggered by heavy hot working.

As a result, a heavily worked cylinder 33 with a quasi-single crystal 34 is obtained with a large amount of substructure and without destroying the maintenance of high modulus <111> orientation along the axis 31. The cylinder 33 may not yield a recognizable X-ray or electron diffraction pattern reflecting the crystal symmetry, as it does for a cast single crystal. Nonetheless, the crystallographic nature of the cylinder 33 may be confirmed by running X-ray diffraction intensity vs. Bragg angle scan and the elastic modus can be measured either by sound velocity or mechanical means.

The cylinder 33 is then subjected to a limited recrystallization process and direct age heat treatment at step 36 to produce a rod or cylinder 37 with a Young's modulus in the <111> orientation ranging from about 37 to about 40 Mpsi (~255-~276 GPa). Again, the process of step 36 is conducted at a temperature below the recrystallization temperature of the alloy.

Figure 7:
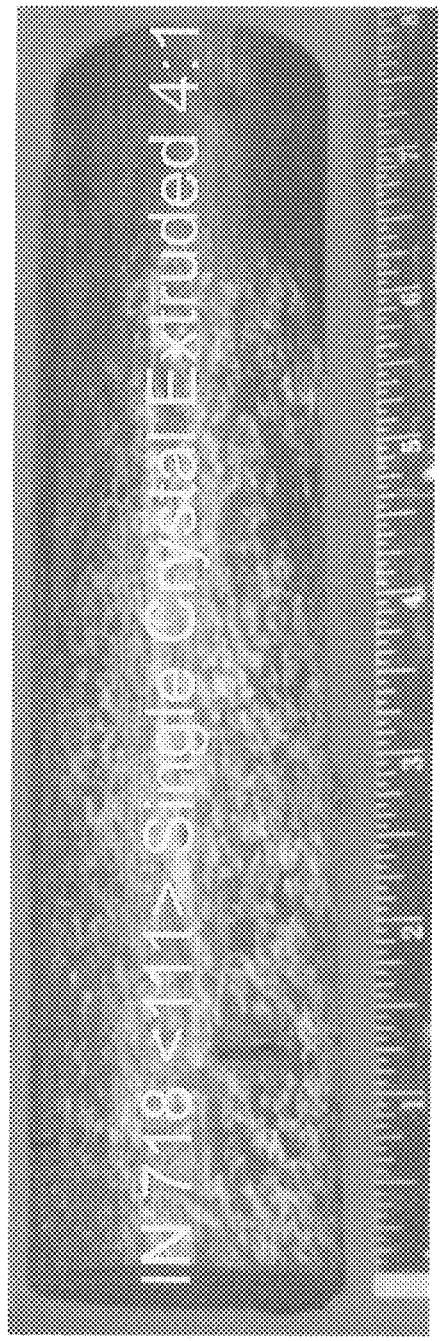
FIG. 7 illustrate a high modulus <111> oriented IN 718 single crystal ingot successfully extruded with 50% reduction in diameter and confirmed to show 30% improvement in modulus over conventional polycrystalline material.

The feasibility of method illustrated in FIG. 5 using axisymmetric swaging at a sub-scale level is shown in FIG. 6. Similarly the feasibility of the process at a sub-scale production method such as extrusion is shown in FIG. 7. The process of FIG. 5 has been demonstrated to work for several alloys, requiring adjustment of the pre-heat treatment to soften the material and the swaging temperature. Those well versed with nickel and iron base alloys can easily select these temperatures based on differential thermal analysis (DTA) of liquidus, solidus and solvus temperatures for any given alloy. The hot worked high modulus single crystal then can be subsequently heat treated in a controlled manner to minimize recrystallization to restore optimum balance of engineering properties.

It is recognized that depending on the specific alloy composition, the post-hot work heat treatment may be allowed to fully recrystallize the grain structure if it happens to retain the <111> texture. However, this method can only be practiced for limited class of alloys. One disclosed method will be to limit the recrystallization so that high modulus <111> texture is largely retained as a quasi-single crystal with a large amount of dislocation sub-structure and high dislocation density. The heavily worked structure with a high dislocation density coupled with low temperature precipitation in many nickel base superalloys as well as iron base alloys or steel will be sufficient to achieve a balance of other engineering properties such as tensile strength, and fatigue life. Direct aging of IN718 is one example of such behavior, well known to those well versed in the art of making structural components such as discs and shafts in jet engines.

Preliminary 1000° F. tensile test results of some swaged alloys presented in the following table bear out the fact that not only such an hypothesis is correct but hot working single crystal holds even greater potential for improving tensile strength and consequently torsion capability. Almost 30% increase in YS and UTS strength was achieved compared to a typical wrought alloy. Traditionally it is assumed that ultimate torsion strength is 70% of UTS and on that basis, the results reflect the potential for improving torsion strength as well.

| Comparison of 1000° F. Tensile Test Results. | | | | | |
| --- | --- | --- | --- | --- | --- |
| Temp (F.) | Yield (ksi) | UTS (ksi) | % EL | % RA | Modulus (MSI) |
| Hot Worked Waspaloy ® | | | | | |
| 1000 | 147.5 | 211.6 | 25.6 | 20.6 | 28 |
| As swaged <111> PWA 1484 | | | | | |
| 1000 | 222.5 | 256.9 | 6.5 | 6.5 | 40.9 |
| 1000 | 178.7 | 236.8 | 8.7 | 11.8 | 41.6 |

| Comparison of 1000° F. Tensile Test Results. | | | | | |
| --- | --- | --- | --- | --- | --- |
| Temp (F.) | Yield (ksi) | UTS (ksi) | % EL | % RA | Modulus (MSI) |
| Swaged + Aged <111> PWA 1484 | | | | | |
| 1000 | 230.6 | 254.5 | 6.5 | 5.9 | 38.8 |
| 1000 | 223.9 | 226.3 | 3.3 | 4.9 | 42.8 |
| Swaged + Aged <111> Udimet 720 LI | | | | | |
| 1000 | 234.4 | 243.6 | 3.9 | 5 | 38.8 |
| 1000 | 226.6 | 249.5 | 8.2 | 6.3 | 37.8 |

Hot working of single crystal presents the added advantage of distributing the hot work homogeneously throughout the body of the material by eliminating the elasto-plastic incompatibility between grains, which is inevitable in polycrystalline material. There is plenty of experimental evidence to suggest that in polycrystalline material some grains owing to their unfavorable orientation and incompatibility with the neighboring grain do not respond to the hot work, thereby bringing down the average enhancement in strength due to work hardening. Coarser the starting grain size, worst is this situation. In case of single crystal this situation is eliminated provided uncontrolled shear along limited slip system is not allowed by well selected hot working strategy.

Furthermore the fact that same level of strengthening was achieved in a single crystal alloy PWA 1484 and a typical wrought alloy Udimet 720 LI, by hot working <111> oriented single crystal, clearly suggests that the strength enhancement was purely due to work hardening or increase in uniform dislocation density.

Those well versed in the art will immediately recognize that the proposed approach could be used to further enhance the strength in solid solution strengthened alloys containing no precipitate structure such as Hastealoy-X, and such an approach may provide a better opportunity to enhance strength without loss of ductility.

Also, if retention of high modulus were not required, then in case of precipitation hardened alloys, additional strength enhancement may be achieved by allowing the material to recrystallize and adding precipitation strengthening as well as fine grain strengthening.

Starting with a highly oriented high modulus (~40-44 Mpsi; ~276-304 GPa) direction with <111> oriented single crystal cylinder 30 leaves a lot of latitude for retaining the high modulus for alloys including those that tend to form random grain texture. This is distinctly different from prior art approaches where the starting cylinder 21 has intermediate level of elastic modulus (~30 Mpsi; ~207 GPa), followed by recrystallization of the random texture (see steps 25, 26 of FIG. 4), which works only for certain alloy compositions.

It is realized that for some specific alloys, it may be more advantageous to start with single crystal in different orientation such as <110>, <112>, <100> or <123>, or even columnar grain material, if the recrystallization texture ultimately leads to strong <111> texture. The disclosed process suggests a novel way of starting with directionally solidified single crystal 30 or columnar grain material 30, in contrast to conventional methods for making high modulus shaft that start with a cast or consolidated particle ingot 21. For most classes of nickel and iron base alloys, <111> oriented single crystal may be the practical approach.

In this context it is also recognized that some iron base alloys and steels where strength could be derived from martensitic transformation, the end orientation or grain texture, may systematically shift from the starting orientation owing to habit plane relationship between the parent phase and resulting martensitic phase. In such a situation depending on the combination of strength and modulus desired, deviation from the <111> orientation may be desirable.

It is also recognized that unconventional hot working processes such as twist extrusion and equal channel angular extrusion also may be used to enhance strength, and may present added advantage in terms of selection of starting single crystal orientation. For example a combination of such technique may allow to convert a starting single crystal in <100> orientation to a high modulus <111> textured material, presenting a manufacturing advantage at the casting stage by eliminating seed requirement, as <100> is a natural growth direction.

INDUSTRIAL APPLICABILITY

The disclosed process is a combination of process steps. First, a single crystal casting can be seeded to produce a desirable crystallographic orientation. Large single crystal castings, approaching one foot in diameter and several feet in height can be cast by conventional investment casting or zone melting. Further, hollow single crystal cylinders can also be cast using ceramic or refractory metal cores. Single crystal casting of selected orientation can be axisymmetrically hot worked followed by limited recrystallization or direct age treatment using various techniques to achieve desired grain texture. Optimum processing parameters in all steps may differ from alloy to alloy, but none of the processes are fundamentally expected to be limited to a specific composition of nickel or iron base alloys.

Nickel base and iron base (steel) shafts generally possess high toughness and high ductility. Achieving high elastic modulus in these classes of materials makes their application as a high modulus shaft material much less riskier than high modulus composite shafts. Changing the grain texture has only a secondary influence on the plastic behavior of the material.

What is claimed is:

1. A method of producing a high elastic modulus shaft from a nickel based alloy, the method comprising:
providing a single crystal cylinder of the alloy, the single crystal cylinder having a longitudinal axis, the single crystal cylinder being seeded so that a high modulus <111> direction is at least substantially parallel to the longitudinal axis;
hot working the cylinder to achieve a cylindrically shaped shaft of a desired size;
heat treating the shaft after the hot working step in order to subject the shaft to a limited recrystallization process at a temperature below a recrystallization temperature of the alloy in order to produce a shaft having a desired elastic modulus.

2. The method of claim 1 wherein the hot working step comprises axisymmetrically hot working the cylinder.

3. The method of claim 1 wherein the heat treating step is direct age heat treating.

4. The method of claim 1 wherein subsequent to the heat treating a Young's modulus in the <111> direction of the shaft is greater than about 37 Mpsi (255 GPa).

5. The method of claim 1 wherein subsequent to the heat treating a Young's modulus in the <111> direction of the shaft ranges from about 37 to about 45 Mpsi (from about 255 to about 310 GPa).

6. The method of claim 1 wherein the cylinder is solid.

7. The method of claim 1 wherein the cylinder is hollow.

8. A method of producing a high elastic modulus shaft from a nickel based alloy, the method comprising:
casting a single crystal cylinder from the alloy, the single crystal cylinder having a longitudinal axis, the single crystal cylinder being seeded so that a high modulus <111> direction is at least substantially parallel to the longitudinal axis of the cylinder;
axisymmetrically hot working the cylinder to achieve a cylindrically shaped shaft of a desired size at a temperature below a recrystallization temperature of the alloy;
heat treating the shaft after the hot working step in order to subject the shaft to a limited recrystallization process at a temperature below the recrystallization temperature of the alloy in order to produce a shaft having a desired elastic modulus.

9. The method of claim 8 wherein the heat treating step is direct age heat treating.

10. The method of claim 8 wherein subsequent to the heat treating a Young's modulus in the <111> direction of the shaft is greater than about 37 Mpsi (255 GPa).

11. The method of claim 1 wherein subsequent to the heat treating a Young's modulus in the <111> direction of the shaft ranges from about 37 to about 45 Mpsi (from about 255 to about 310 GPa).

12. A method of producing a high strength and/or high torque resistant shaft from a nickel based alloy, the method comprising:
providing a single crystal cylinder of the alloy, the single crystal cylinder having a longitudinal axis, the single crystal cylinder being seeded so that a high modulus <111> direction is at least substantially parallel to the longitudinal axis;
hot working the cylinder to achieve a cylindrically shaped shaft of a desired size;
heat treating the shaft after the hot working step in order to subject the shaft to a limited recrystallization process at a temperature below or above a recrystallization temperature of the alloy to maximize the strength of a shaft to a desired strength.

13. The method of claim 12 wherein the hot working step comprises axisymmetrically hot working the cylinder.

* * * * *